(12) United States Patent
Sudhakar et al.

(10) Patent No.: US 7,506,239 B2
(45) Date of Patent: Mar. 17, 2009

(54) SCALABLE TRACEBACK TECHNIQUE FOR CHANNEL DECODER

(76) Inventors: Raghavan Sudhakar, 10715 Bramble Crest Dr., Austin, TX (US) 78726; Ravi Kolagotla, 13009 Coriander Dr., Austin, TX (US) 78729

( * ) Notice: Subject to any disclaimer, the term of this patent is extended or adjusted under 35 U.S.C. 154(b) by 486 days.

(21) Appl. No.: 11/022,212

(22) Filed: Dec. 23, 2004

(65) Prior Publication Data
US 2006/0143554 A1 Jun. 29, 2006

(51) Int. Cl.
*H03M 13/41* (2006.01)

(52) U.S. Cl. .................................................. 714/795
(58) Field of Classification Search ................. 714/795
See application file for complete search history.

(56) References Cited

U.S. PATENT DOCUMENTS

| | | | | | |
|---|---|---|---|---|---|
| 5,946,361 | A | * | 8/1999 | Araki et al. ................. | 375/341 |
| 5,970,097 | A | * | 10/1999 | Ishikawa et al. ............ | 375/262 |
| 5,991,341 | A | * | 11/1999 | Shin ........................... | 375/265 |
| 6,324,226 | B1 | * | 11/2001 | Sasagawa .................... | 375/341 |

* cited by examiner

*Primary Examiner*—Stephen M Baker
(74) *Attorney, Agent, or Firm*—Kacvinsky LLC

(57) ABSTRACT

Apparatus, system, and method for scalable traceback techniques for channel decoding are described.

16 Claims, 5 Drawing Sheets

SCALABLE TRACEBACK TECHNIQUE FOR CHANNEL DECODER

BACKGROUND

Implementation of mobile radio based on processors or digital signal processors (DSP) demands computationally intensive receiver processing techniques and a high level of programmability. There may be a need to cover a wide range of data rates to support a family of standards such as Global System for Mobile Communications (GSM), General Packet Radio Services (GPRS), Enhanced-GPRS (EGPRS), and Wide-Band Code Division Multiple Access (W-CDMA), thus impacting the performance requirements of wireless devices (e.g., handsets). Further, specific implementation of services such as Adaptive Multi-Rate (AMR) in GSM handset radio severely impacts a DSP power dissipation budget requirement. Thus, reducing power consumption and increasing performance are general design goals for wireless handset devices.

Channel encoding and decoding functional blocks are prominent among the various functional blocks that demand a high level of DSP performance and power consumption in a GSM radio device. The channel encoder adds redundancy to the transmitted data while the receiver decoder may use this data to repair any corrupted underlying information data.

To meet the performance requirements and power constraints of a processor, computationally intensive channel decoding techniques should be implemented efficiently.

A typical implementation of a Viterbi decoder generally consists of two stages. An add-compare-select (ACS) stage and a traceback stage. Though the ACS stage may be computationally intensive, techniques exist to speed up its operation by employing multiple execution units in parallel. On the other hand, due to its sequential in nature, the traceback stage cannot easily be parallelized, and may consume an appreciable fraction of the DSP or hardware cycles.

Presently, a typical DSP implementation of the traceback operation for a 16-state decoder, takes five DSP cycles per decoded bit, to perform the required shift, index addressing, and memory accesses. The DSP cycles per decoded bit increase substantially with larger constraint lengths. For example, a 64-state decoder (e.g., constraint length "K"=7) may require nine DSP cycles per decoded bit, to move the 64 bits of the traceback vector from an on-chip memory to the appropriate registers, and then to search for the traceback bit within the 64 bits. Similarly, a 256-state decoder (e.g., K=8) may require 12 DSP cycles per decoded bit.

Although conventional Viterbi hardware accelerators perform the traceback computation in one cycle per decoded bit, they require a substantial amount of hardware support for large constraint lengths, resulting in increased memory accesses and power consumption. For example, a typical 256-state decoder with an 8-bit state requires a complex 256:1 multiplexer tree and a multi-cycle loading of a 256-bit traceback vector register.

DETAILED DESCRIPTION

Figure 1:
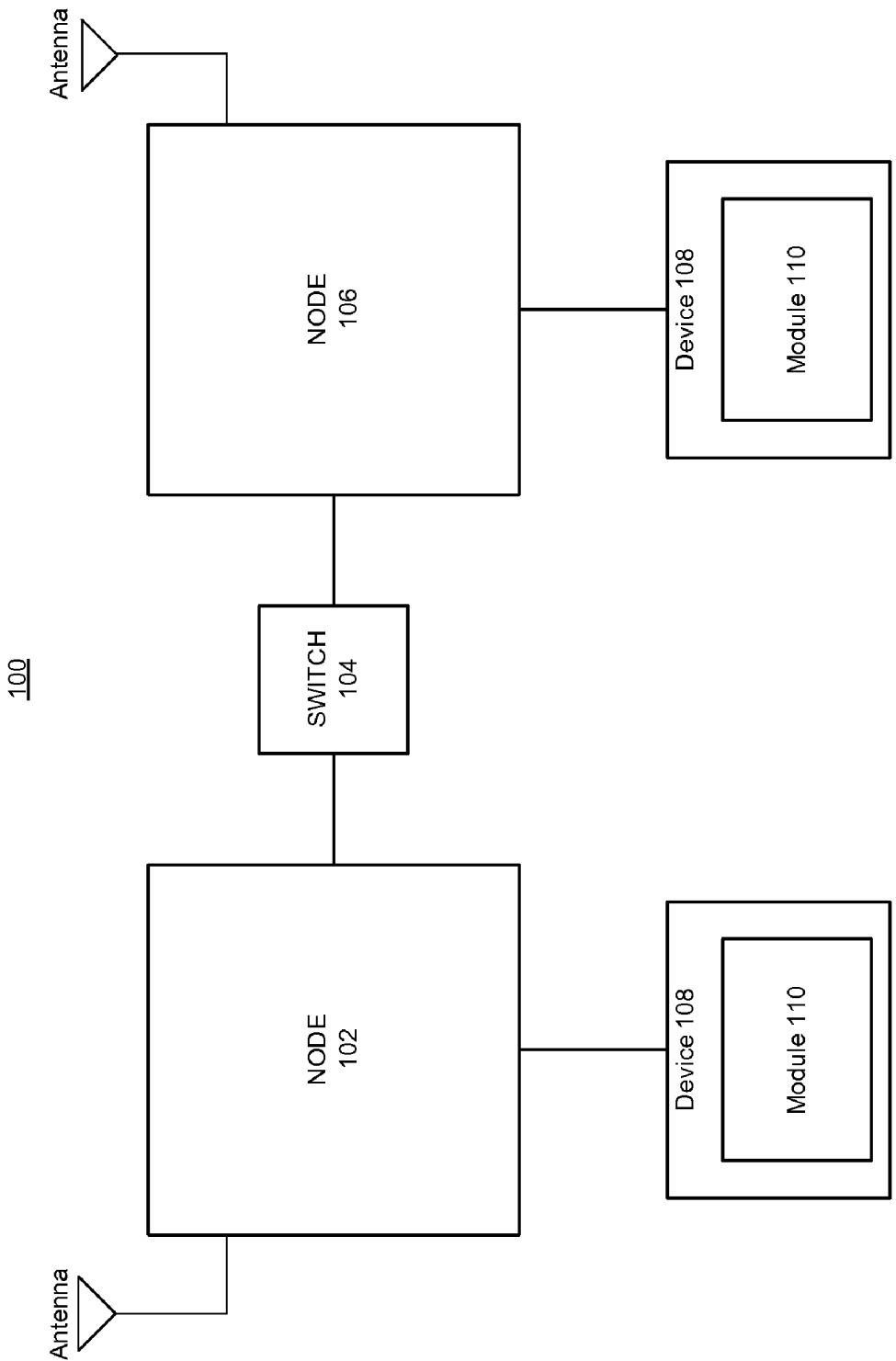
FIG. 1 illustrates a block diagram of a system 100.

FIG. 1 illustrates a block diagram of a system 100. System 100 may comprise, for example, a communication system having multiple nodes. In one embodiment, a node may comprise switching devices whose purpose is to provide communication. A node may be in communication with and may comprise a station or an end device that wishes to communicate via the node. Each station may attach to a node. Two or more nodes may be arranged in a topology by one or more transmission links. A collection of two or more nodes may be referred to as a communication network. In one embodiment, a node may comprise any physical or logical entity having a unique address in system 100. Examples of a node may comprise, for example, a computer, server, workstation, laptop, ultra-laptop, handheld computer, telephone, network device, proprietary network device, portable digital music player, set-top box, cellular telephone, mobile telephone, wireless device, personal digital assistant (PDA), networked PDA, pager, two-way pager, eWallet, router, switch, bridge, hub, gateway, wireless access point (WAP), and so forth. The unique address may comprise, for example, a network address such as an Internet Protocol (IP) address, a device address such as a Media Access Control (MAC) address, and so forth. The embodiments are not limited in this context.

The nodes of system 100 may be arranged to communicate different types of information, such as media information and control information. Media information is used herein in a very general sense and may refer to any data, for example, data representing content meant for a user, voice information, video information, audio information, text information, numerical information, alphanumeric symbols, graphics, images, and so forth. Control information also is used herein in a very general sense and may refer to any data representing commands, instructions or control words meant for a machine or automated system. For example, control information may be used to route media information through a system, or instruct a node to process the media information in a predetermined manner.

The nodes of system 100 may communicate media and control information in accordance with one or more protocols. A protocol may comprise a set of predefined rules or instructions to control how the nodes communicate information between each other. The protocol may be defined by one or more protocol standards as promulgated by a standards organization, such as the Internet Engineering Task Force (IETF), 3rd Generation Partnership Project (3GPP), International Telecommunications Union (ITU), the Institute of Electrical and Electronics Engineers (IEEE), and so forth.

System 100 may be implemented as a wired communication system, a wireless communication system, or a combination of both. Although system 100 may be illustrated using a particular communications media by way of example, it may be appreciated that the principles and techniques discussed herein may be implemented using any type of communication media and related technology. The embodiments are not limited in this context.

When implemented as a wired system, system 100 may include one or more nodes arranged to communicate information over one or more wired communications media. Examples of wired communications media may include a wire, cable, printed circuit board (PCB), backplane, switch fabric, semiconductor material, twisted-pair wire, co-axial cable, fiber optics, and so forth. The communications media may be connected to a node using an input/output (I/O) adapter. The I/O adapter may be arranged to operate with any suitable technique for controlling information signals between nodes using a desired set of communications protocols, services or operating procedures. The I/O adapter may also include the appropriate physical connectors to connect the I/O adapter with a corresponding communications medium. Examples of an I/O adapter may include a network interface, a network interface card (NIC), disc controller, video controller, audio controller, and so forth. The embodiments are not limited in this context.

When implemented as a wireless system, system 100 may include one or more wireless nodes 102, 106 arranged to communicate information over one or more types of wireless communication media. An example of a wireless communication media may include portions of a wireless spectrum, such as the radio-frequency (RF) spectrum. The wireless nodes 102, 106 may include components and interfaces suitable for communicating information signals over a designated wireless spectrum, such as one or more antennas, wireless transmitters/receivers ("transceivers"), amplifiers, filters, control logic, and so forth. Examples of antennas may comprise an internal antenna, an omni-directional antenna, a monopole antenna, a dipole antenna, an end fed antenna, a circularly polarized antenna, a micro-strip antenna, a diversity antenna, a dual antenna, an antenna array, a lead-frame antenna, and so forth. The embodiments are not limited in this context.

Embodiments of wireless communication systems may comprise, for example, Code Division Multiple Access (CDMA), third generation (3G) systems like Wide-band CDMA (WCDMA), CDMA-2000, other next generation wireless telecommunication systems, North American Digital Cellular (NADC), Time Division Multiple Access (TDMA), Extended-TDMA (E-TDMA), Global System for Mobile Communications (GSM), General Packet Radio Services (GPRS), Enhanced-GPRS (EGPRS), as well as wireless local area network technology (e.g., 802.11, 802.11a, 802.11b, 802.11g) or the like.

Wireless nodes 102, 106 may comprise a switch such as a WAP, a mobile switching center (MSC), a wireless base station or Node B, a radio network controller (RNC), and so forth. A mobile switching center may comprise, for example, a telephone switch, similar to a central office switch to bridge a mobile wireless telephone network with another telephone network such as the public switched telephone network (PSTN). A wireless base station may provide: air interface transmission; reception, modulation; demodulation, wireless communication systems physical channel coding (e.g., CDMA and others listed above), micro diversity, error handling, and closed loop power control, for example. Other examples may comprise a base transceiver station (BTS) to act as transmit and receive link for a mobile communication system to communicate with a mobile phone, for example. A BTS may connect to a base station controller (BSC) over a T1/E1 line. A BSC may operate with one or more BTSs to link wireless devices, such as cellular phones, with a wireline telephone network. Wireless nodes 102, 106 also may comprise, for example, an RNC to provide wireless data services to link wireless devices, such as Internet-enabled mobile phones, with the Internet, for example.

Wireless nodes 102, 106 also may comprise or be in communication with wireless end-devices, stations or apparatuses such as electronic devices, handheld electronic devices, battery operated electronic devices, portable electronic devices, wireless devices including transceivers, transmitters, and receivers of a radio system. A wireless device may comprise a mobile or cellular phone, a computer equipped with a wireless access card or modem, a handheld client device such as a wireless PDA, an. integrated cellular telephone/PDA. A radio system intended to be included within the scope of the embodiments may include, by way of example only, cellular radiotelephone communication systems, satellite communication systems, two-way radio communication systems, one-way pagers, two-way pagers, personal communication systems (PCS), PDA systems, and the like.

Nodes 102, 106 may communicate information to each other by way of circuit switching or in the form of packets, for example. A packet in this context may refer to a set of information of a limited length, with the length typically represented in terms of bits or bytes. An example of a packet length might be 64 bytes. For example, node 102 may break a set of media information into a series of packets. Each packet may contain a portion of the media information plus some control information. The control information may assist various intermediate nodes, between nodes 102, 106, for example, to route each packet to its intended destination, such as node 106. The destination node 106 may receive the entire set of packets and use them to reproduce the media information communicated from node 102. Although FIG. 1 is shown with a limited number of nodes arranged in a certain topology, it may be appreciated that system 100 may include more or less nodes arranged in a variety of topologies as desired for a given implementation. The embodiments are not limited in this context.

In one embodiment, system 100 may comprise switch 104, which may comprise for example, a switch, router, and the like, (collectively referred to herein as "switch 104") to provide a communication bridge between nodes 102 and 106. Switch 104 also may operate in accordance with one or more media access control protocols, such as from the IEEE 802.3 series of Ethernet protocols, among others. For example, switch 104 may be a high bandwidth switch, such as a Fast Ethernet switch operating at 100 megabits per second (Mbps), a Gigabit Ethernet switch operating at 1000 Mbps, and so forth. The embodiments are not limited in this context.

In one embodiment, switch 104 may comprise an interface between a base station system and a switching subsystem of a mobile telephone network such as, for example, an MSC, BSC, RNC, BTS, Node B or the like. In this context, switch 104 may comprise control and switching elements for a cellular system housed by a Mobile Telephone Switching Office (MTSO), for example, to process traffic between cell sites of a cellular system and the PSTN. Also, switch 104 may play a role in subscriber roaming by providing all the necessary functionality involved in registering, authenticating, location updating, and call routing for a roaming subscriber, for example.

Switch 104 may switch packets between the various nodes of the system 100. For example, switch 104 may switch packets from a source node 102 to a destination node 106. Each packet may include a source address and destination address. The switch 104 may receive the packet, retrieve the destination address, and send the packet to an intermediate node or destination node based on the destination address. System 100 may operate to transfer information between node 102 and node 106 via switch 104. Switch 104 may comprise one or more processors to communicate information (e.g., packets) between the switch 104 and any of one of the nodes 102, 106, for example.

Referring again to FIG. 1, nodes 102 and 106 may comprise device 108. Alternatively, nodes 102, 106 may be in communication with device 108. In one embodiment, device 108 may comprise electronic devices, battery operated electronic devices, portable electronic devices, handheld devices, wireless devices, and/or multimedia devices. These devices may further comprise, for example, a computer, server, workstation, laptop, ultra-laptop, handheld computer, telephone, network device, proprietary network device, portable digital music player, set-top box, cellular telephone, mobile telephone, wireless telephone, personal digital assistant (PDA), networked PDA, pager, two-way pager, eWallet, router, switch, bridge, hub, gateway, wireless access point (WAP), Moving Pictures Expert Group (MPEG) layer III (MP3) device, global positioning system (GPS) navigation devices, portable games, digital video disk (DVD) devices, DVD video picture books, and iPod. In one embodiment, device 108 may further comprise module 110, for example. In one embodiment, module 110 may be implemented with and/or operate under the control of a control unit, which may comprise, for example, a circuit, an integrated circuit, an integrated circuit array, a chipset comprising an integrated circuit or an integrated circuit array, an element of an integrated circuit array or a chipset, a stacked integrated circuit array, a logic circuit, a memory, a processor, a cellular processor, a system on a chip, a DSP, a programmable logic device (PLD), code, firmware, software, and any combination thereof.

Figure 2:
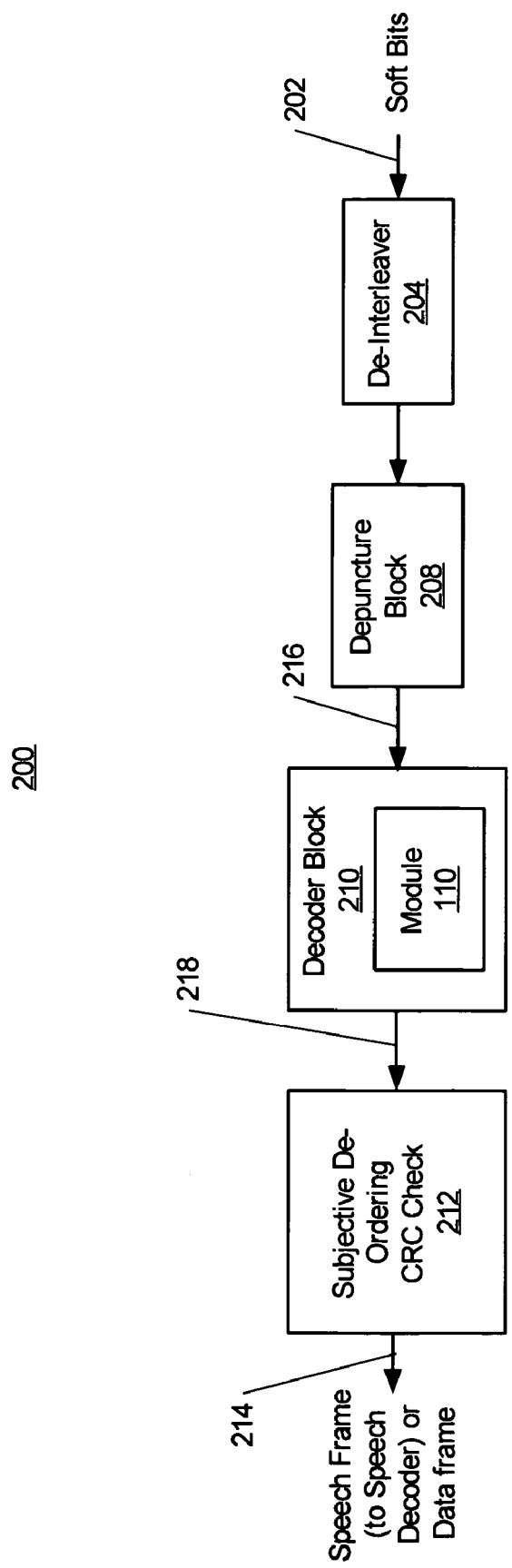
FIG. 2 illustrates a block diagram of a channel decoder 200.

FIG. 2 illustrates a block diagram of an AMR channel decoder 200 to decode speech frames. In one embodiment, channel decoder 200 comprises decoder block 210, which in turn, comprises module 110 of nodes 102, 106 as described with reference to FIG. 1. The term "block" is used herein in a very general sense and may refer to various function, which may implemented with and/or operate under the control of a control unit comprising, for example, a circuit, an integrated circuit, an integrated circuit array, a chipset comprising an integrated circuit or an integrated circuit array, an element of an integrated circuit array or a chipset, a stacked integrated circuit array, a logic circuit, a memory, a processor, a cellular processor, a system on a chip, a DSP, a programmable logic device (PLD), code, firmware, software, and any combination thereof. As shown in FIG. 2, decoder 200 comprises a de-interleaver block 204 with an input portion to receive soft bits 202 corresponding to demodulated received bursts. De-interleaver 204 is connected to a depuncture block 208, which in turn is connected to a decoder block 210. In one embodiment, decoder block 210 may represent a Viterbi Decoder, for example. In another embodiment comprising AMR services, decoder block 210 may comprise a Recursive Convolutional (RC) decoder. In one embodiment, decoder block 210 is connected to a subjective de-ordering CRC check block 212. The latter block outputs a speech frame to a speech decoder or data frame for packet data, for example. In summary, the process of channel decoding comprises de-puncturing the de-interleaved soft bits 202 by de-puncture block 208, providing the de-punctured bits to an input portion 216 of decoder block 210 for convolutional decoding, and subjective reordering and CRC checking at block 212.

In one embodiment, soft bits 202 may represent codes to be decoded by decoder 200, for example. In one embodiment for GSM radio, the received soft bits 202 may comprise a block of 456 GSM samples (four GSM bursts), for example. The demodulated received block of 456 samples are provided to de-interleaver block 204 and are subjected to a frame classification procedure to identify the type of frame to be decoded. After de-interleaving the frame, de-puncture block 208 accounts for the bits that were not transmitted by the transmitter by inserting dummy bits at their locations. The de-interleaved depunctured soft bits symbols 216 are provided to channel decoder block 210. Decoder block 210 may comprise, for example, module 110 to implement one or more functional aspects of decoder block 210, for example. The decoder block 210 recovers the encoded speech data. The binary output 218 of the decoder block 210 may be split into class "1a" and class "1b" bits. Class "1a" and "1b" bits then may be reordered together with class "2" bits, for example. The reordered binary output 214 is fed to a speech decoder or to the packet synthesizer, along with a class "1a" CRC pass/fail indication. The speech decoder then reconstructs the valid speech samples, for example.

Figure 3:
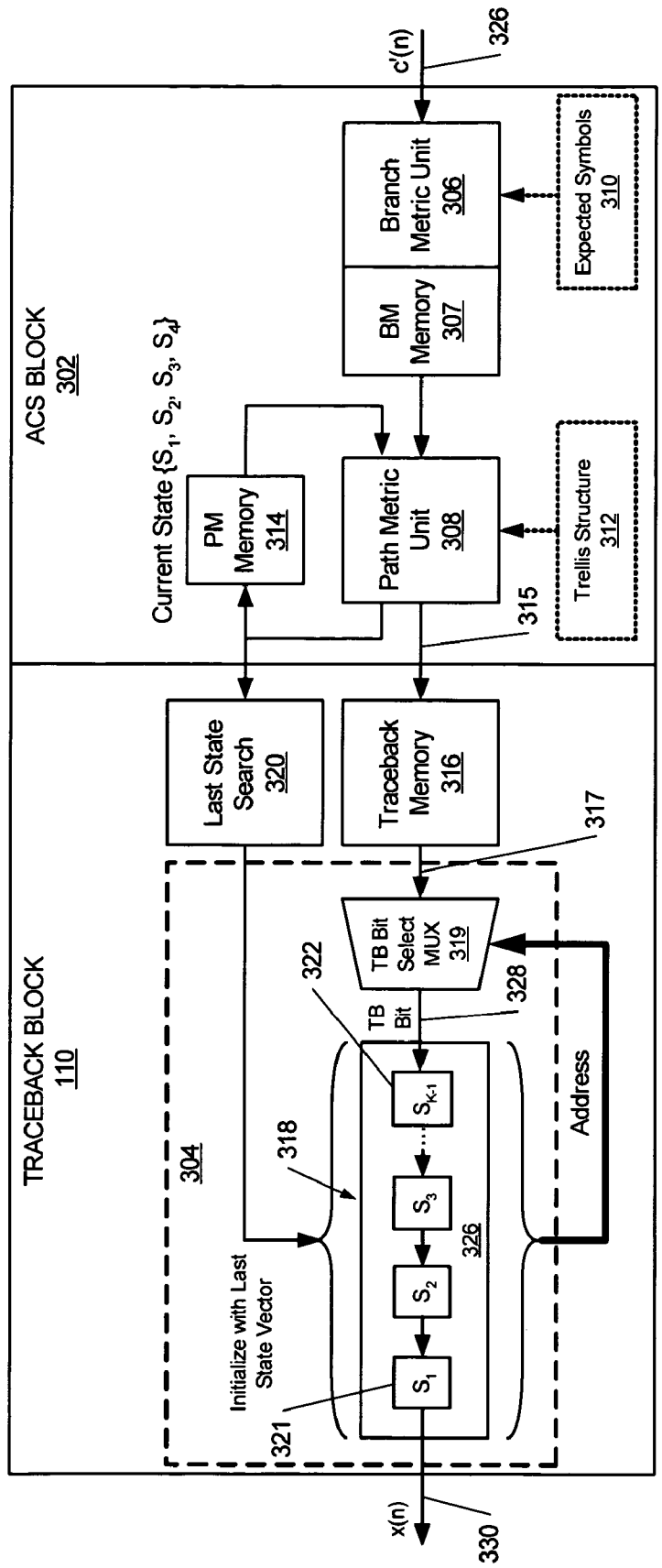
FIG. 3 illustrates a block diagram of a decoder block 210.

FIG. 3 illustrates a block diagram of a multi-stage realization of decoder block 210. In one embodiment, decoder block 210 may form a portion of a GSM-AMR radio based implementation and may comprise a two-stage realization as shown in FIG. 3. In one embodiment the multi-stage realization may comprise, for example, add-compare select (ACS) block 302 and traceback block 304. ACS block 302 and traceback block 304 may constitute a Viterbi decoder for example. In Viterbi decoding, for example, received corrupted coded symbols, such as for example soft bits 216 (FIG. 2) or 326, are compared with all the possible expected symbols using a specific metric (usually the Euclidean distance between symbols) to find the most probable set of "states" and hence the most probable sequence that was input to the encoder. Although the operation of ACS block 302 is computationally intensive, it may be sped up by employing multiple parallel execution units. On the other hand, the operation of traceback block 304 is sequential in nature and may not easily be parallelized. Accordingly, operation of traceback block 304 may consume an appreciable fraction of DSP cycles, for example, especially when multiple ACS blocks 302 are parallelized.

ACS block 302 of decoder block 210 may comprise, for example, a branch metric unit 306 to perform branch metric computations and a path metric unit 308 to perform path metric computations. Branch metric unit 306 receives symbols 216 (e.g., depunctured symbols) to be decoded and using expected symbols 310 computes a branch metric that may represent the maximum correlation between received symbols 216 and expected encoder outputs at 310 for each trellis transition on a bit-by-bit basis. The computed branch metric may be stored in branch metric memory 307, for example. The stored branch metric then may be provided to path metric unit 308. Path metric unit 308 computes a path metric at a trellis node (state) in a trellis structure 312. The computed path metric may be stored in path metric memory 314, for example. The computed path metric represents a sum of the associated branch metrics. The ACS block 304 calculates new candidate path metrics at each trellis node of a stage, selects the best candidate path metric (path with the largest path metric correlation), stores it in path metric memory 314, and writes the address of the best candidate, referred to herein as a shift-out bit 315 to the traceback memory 316 in traceback block 304. The operations of ACS block 302 may be repeated for each state and every stage of the trellis, for example.

In general operation, ACS block 302 calculates new candidate path metrics at all trellis states at each instant (stage), selects the best candidate path metric, and saves the pointer (termed shift-out bit 315) to traceback memory 316. Using a known state and its traceback bit 328, a traceback process backtracks to find the previous state, and hence the decoded bit. The traceback process is a memory intensive sequential operation whose complexity depends on the number of states $N=2^{K-1}$, where K is the constraint length. The group of shift-out bits corresponding to each stage of the trellis produces a traceback vector of size $2^{K-1}$ bits (that is, one shift-out bit for each path metric state) and there may be L such traceback vectors stored in a traceback array, where L is the number of information bits to be decoded. The traceback array is store in the traceback memory 316.

The traceback process decodes the output by traversing backwards from the last state of the trellis. A traceback operation may be analogous to an encoder state machine running backwards in time. For example, in the convolutional encoder, a traceback bit (T) is the previous value (in time) of $S_4$, and the traceback operation corresponds to a state transition from a current state 318 $\{S_{K-1} S_{K-2} S_{K-3} \ldots S_2 S_1\}$ to a previous state $\{T S_{K-1} S_{K-2} S_{K-3} \ldots S_2\}$, producing the decoded output of $S_1$. The least-significant bit position 321 of current state 318 provides a current decoded bit and current state 318 is then updated (backwards in time) by shifting current state 318 and inserting traceback bit 328 at the most-significant bit position 322.

A reversed state traversal of the traceback operation is equivalent to loading a state vector $\{S_{K-1} \ldots S_3 S_2 S_1\}$ in shift register 326 (becoming current vector 318) and using this state vector as the address of traceback bit select multiplexer 319 to locate traceback bit 328 within traceback vector 317. At the start of the traceback operation, state vector 318 is set by the last state vector from 320. In the subsequent cycle, traceback bit 328 is shifted into the shift register units to produce an updated state vector and the Viterbi decoder output 330 (e.g., x(n)).

Accordingly, the traceback process may be characterized by a recursive function where each iteration of the traceback block 304 may be characterized by the following functions, for example:

(1) Load a sequentially stored $2^{K-1}$ bit traceback vector from a traceback memory array stored in traceback memory 316 (in one embodiment, traceback memory 316 is stack memory) for a current state (this may require multiple accesses of traceback memory 316 for coders with 64 or 256 states);

(2) Use current state 318 $\{S_{K-1} \ldots S_3 S_2 S_1\}$ as an index to identify traceback bit 328 among the $2^{K-1}$ bits of the loaded traceback vector;

(3) Save the least-significant bit 321 of current state 318 (e.g., $S_1$) as a Viterbi decoder output bit 324 (e.g., x(n)), if needed;

(4) Create an augmented state by inserting traceback bit 328 next to the most-significant bit position 322 of current state 318 (e.g., $\{T S_{K-1} \ldots S_3 S_2 S_1\}$);

(5) Update current state 318 by shifting the augmented state (e.g, $\{T S_{K-1} \ldots S_3 S_2\}$), and decrementing the current stage index.

Figure 4:
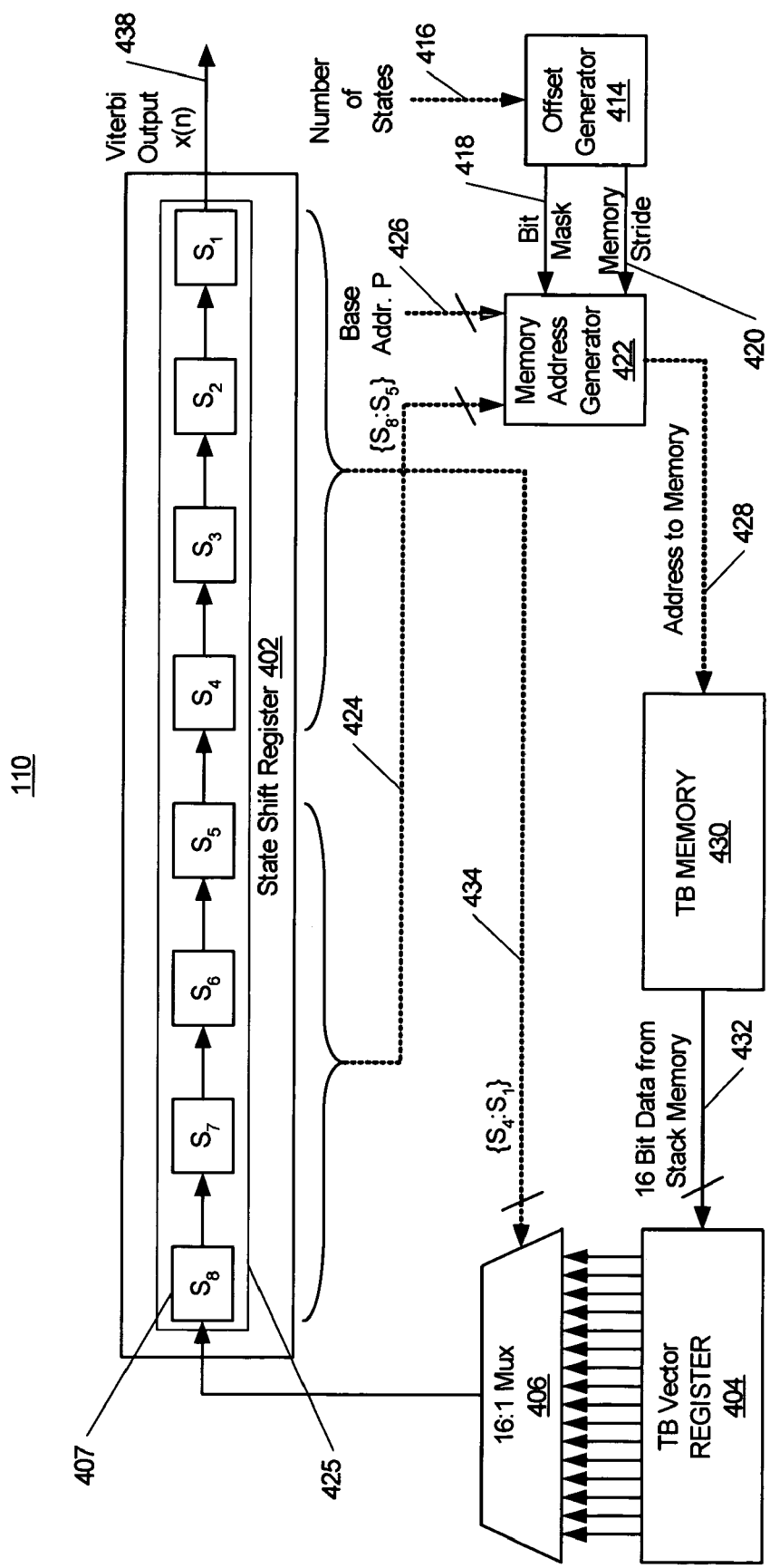
FIG. 4 illustrates a block diagram of a module 110.

FIG. 4 illustrates one embodiment of module 110. As shown in FIG. 4, module 110 may be implemented with and/or operate under the control of a control unit, comprising, for example, a circuit, an integrated circuit, an integrated circuit array, a chipset comprising an integrated circuit or an integrated circuit array, an element of an integrated circuit array or a chipset, a stacked integrated circuit array, a logic circuit, a memory, a processor, a cellular processor, a system on a chip, a DSP, a programmable logic device (PLD), code, firmware, software, and any combination thereof. Although FIG. 4 shows a limited number of elements, it can be appreciated that additional or fewer elements may be used in module 110 as desired for a given implementation. In one embodiment, module 110 may be realized as a hardware enhancement to DSP architecture to perform a single iteration traceback in one DSP cycle, irrespective of the number of states (e.g., $2^{K-1}$=N=16, 64 or 256 states).

In one embodiment, module 110 may include a generalized traceback circuit for $2^{K-1}$=N=16, 64, and 256 state traceback operations. Assuming 16-bit memory organization, a generalized 256-state traceback operation is illustrated in FIG. 4. Module 110 may form one embodiment of a hardware mapped functional block of the six iterative functional traceback operations described previously. As shown in FIG. 4, one embodiment of module 110 may comprise an interconnection of several elements. Accordingly, module 110 may comprise an eight-bit shift register 402 to hold a current state 425 $\{S_8 S_7 S_6 S_5 S_4 S_3 S_2 S_1\}$ (e.g., up to 256 states). Further, module 110 may comprise a 16-bit traceback vector register 404 connected to a 16:1 bit multiplexer 406 controlled by current state 434 $\{S_4 S_3 S_2 S_1\}$, for example. Module 110 also may comprise an offset generator 414 connected to a memory address generator 422. Offset generator 414 takes a current state size 416 (e.g., number of states=N=16, 64 or 256) as input and provides a bit mask 418 output (0, 3, and 15, respectively), and a memory stride 420 output (1, 4, and 16, respectively) to memory address generator 422. Memory address generator 422 receives these inputs in addition to the most significant four bits 424 $\{S_8 S_7 S_6 S_5\}$ of state register 402 and a base address pointer 426 register value (P) and generates a memory address of the traceback vector sequentially stored in traceback memory 430, for example. In one embodiment, traceback memory 430 may be stack memory of the processor (e.g., DSP). Those skilled in the art will appreciate that for a 64 state decoder the most significant two bits of current state 425 $\{S_6 S_5\}$ in state register 402 are provided to memory address generator 422 along with the appropriate bit mask 418, memory stride 420, and base address pointer 426 register value (P). Based on these inputs, memory address generator 422 generates a memory address 428 of the next traceback vector sequentially stored in traceback memory 430.

As described above, in one embodiment, for N=16, offset generator 414 takes a current state size 416 of "16," for example, and outputs a bit mask 418 of "0" and a memory stride 420 of "1." Likewise, in one embodiment, for N=64, offset generator 414 takes a current state size 416 of "64," for example, and outputs a mask bit 418 of "3" and a memory stride 420 of "4." Similarly, in one embodiment, for N=256, offset generator 414 takes a current state size 416 of "256," for example, and outputs a bit mask of "15" and a memory stride 420 of "16." Further, selecting base address 426 (P) as a multiple of 16, will replace a 32-bit add operation required for a memory address calculation to a trivial 4-bit least significant bit (LSB) field insertion. Also, keeping traceback memory 430 in fast memory may lower read latency, and furthermore, provides for pre-loading multiplexer address.

Module 110 represents one embodiment of a generalized circuit that may be used for N=16, 32, 64, 128, and 256 state traceback operations. In general operation of module 110, a 16-bit word 432 containing the traceback bit is loaded into traceback vector register 404, exploiting the fact that the traceback vectors are sequentially stored. Traceback vector register 404 holds a traceback vector loaded from traceback memory 430 from address the memory address 428 calculated by memory address generator 422. Based on state vector 434 $\{S_4 S_3 S_2 S_1\}$ traceback multiplexer 406 selects the traceback bit form one out of the 16 bits 405 in traceback vector register 404 and shifts the traceback bit into the most significant bit (MSB) position 407 of state shift register 402 in the next cycle.

Figures 5, 6:
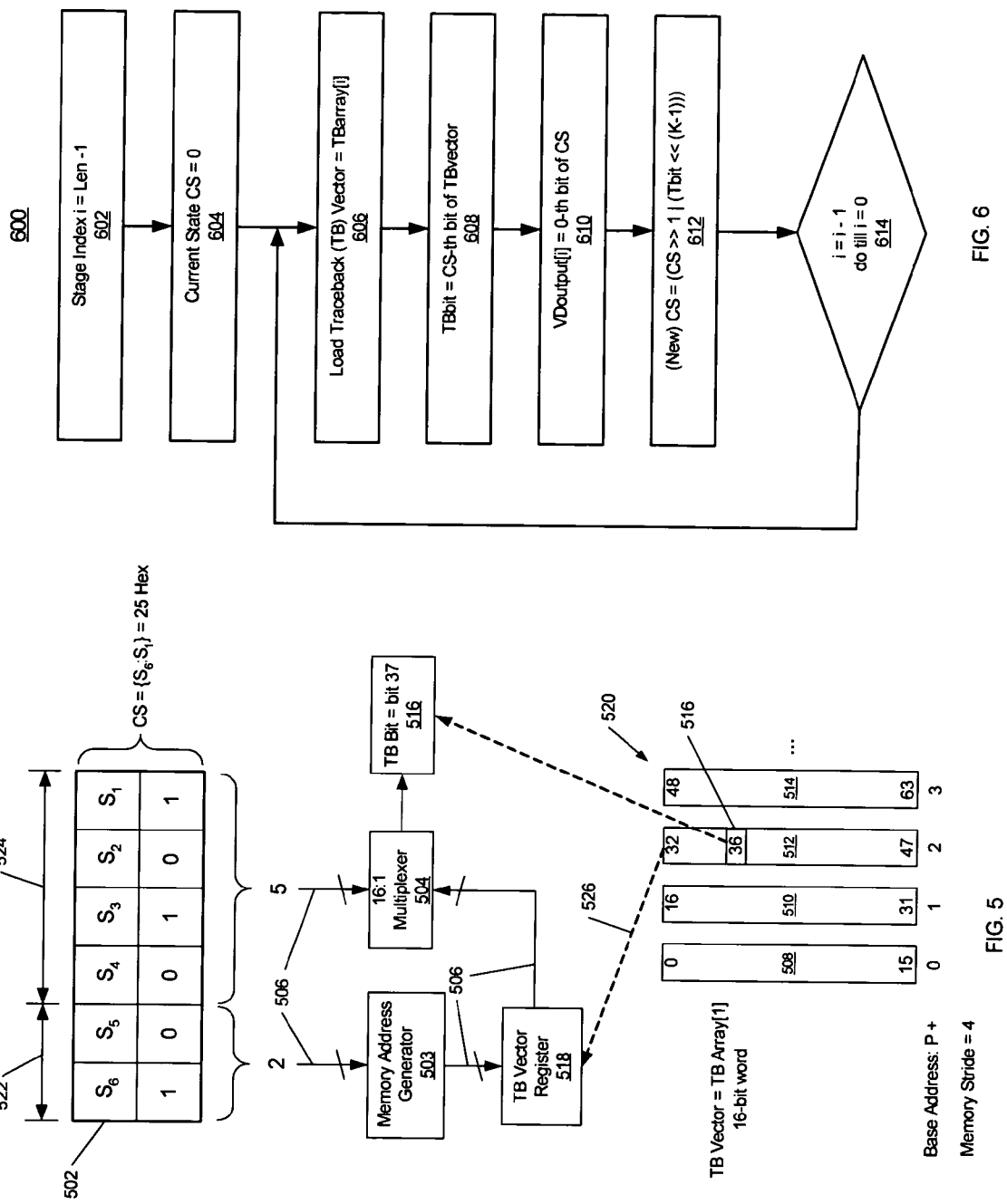
FIG. 5 illustrates a schematic diagram 500 of module 110.
FIG. 6 illustrates a programming logic 600.

FIG. 5 illustrates one embodiment of a schematic diagram 500 of module 110 to show a general operation of module 110 with respect a N=64 state decoder. In one embodiment, module 110 may be used in a 64-state decoder implementation with six-bit current state 502 $\{S_6 S_5 S_4 S_3 S_2 S_1\}$. In one embodiment module 110 may be implemented with a 16:1 multiplexer 504 and associated 16-bit data paths 506 to eliminate the need for large size multiplexers and wider data paths. One embodiment of module 110 may require only one 16-bit memory access (load) of a traceback array 508, 510, 512, 514 and eliminate redundant memory accesses (e.g., three loads for 64-state and 15 loads for 256-state). For example, in a 64-state decoder implementation, module 110 as shown in FIG. 5 requires loading a 16-bit word 512 containing traceback bit 516 into traceback vector register 518, for example. This operation is relatively easy because the traceback vectors 512 are stored in sequential memory locations of traceback memory 520. A 64-bit traceback array 508, 510, 512, 514 corresponding to a current stage may be contained in four consecutive 16-bit memory addresses of traceback memory 520 (e.g., traceback vectors 508, 510, 512, 514) relative to a base address P (P+0, P+1, P+2, and P+3), for example: P+0 (bits 0:15 corresponding traceback vector 508); P+1 (bits 16:31 corresponding traceback vector 510); P+2 (bits 32:47 corresponding traceback vector 512); and P+3 (48:63 corresponding traceback vector 514). In one embodiment, the decimal value of bit string 522 (e.g., bits $\{S_6 S_5\}$) in current state 502 $\{S_6 S_5 S_4 S_3 S_2 S_1\}$ is provided to memory address generator 503 and may provide the address offset relative to base address P of the 16-bit word 512 containing the traceback bit corresponding to the current state 502 $\{S_6 S_5 S_4 S_3 S_2 S_1\}$. For example, as shown in FIG. 5, the decimal value of bit string 522 (e.g., bits $\{S_6 S_5\}$) is in current state 502 $\{S_6 S_5 S_4 S_3 S_2 S_1\}$ is "2" and this points to address "P+2" containing traceback vector or word 512. Thus, only a 16-bit word 512 located at the memory address P+$S_6 S_5$ is loaded into traceback vector register 518, shown schematically by arrow 526. 16:1 multiplexer 504 then identifies the traceback bit 516 using the lower address determined by four-bit string 524 $\{S_4 S_3 S_2 S_1\}$ of current state 502. For example, as shown in FIG. 5, the decimal value of bit string 524 is "5," therefore, the traceback bit 516 is the fifth bit in 16-bit word 512 in address "P+2." The traceback bit 516 is the bit selected by 16:1 multiplexer 504. For decoding a previous stage, the base address P is incremented by a memory stride of four to P'=P+4, and the procedure is repeated.

Accordingly, one embodiment may provide reduced hardware and memory accesses by module 110 by exploiting the sequential storage of traceback vectors. Reduced memory accesses for large state operation, for both DSP and hardware implementations, also may provide enhanced performance and power savings. One embodiment may perform one iteration of a traceback operation in one DSP cycle (for 16, 64 or 256 states), which may be applicable for DSP or hardware accelerator implementations. One embodiment may be scalable to 16, 64, and 256 state decoders and may perform one-cycle traceback iterations irrespective of the number of states, for example. In addition, one embodiment may be used for both Viterbi decoding as well as AMR channel decoding, for example. In one embodiment, a hardware assisted scheme of module 110 may accelerate traceback iterations in DSP as well as hardware accelerator applications to one cycle and may reduce the number of millions of instructions per second (MIPS), memory accesses, data path sizes, and reduce overall energy consumption.

Operations for the above system and subsystem may be further described with reference to the following figures and accompanying examples. Some of the figures may include programming logic. Although such figures presented herein may include a particular programming logic, it can be appreciated that the programming logic merely provides an example of how the general functionality described herein can be implemented. Further, the given programming logic does not necessarily have to be executed in the order presented unless otherwise indicated. In addition, the given programming logic may be implemented by a hardware element, a software element executed by a processor, or any combination thereof. The embodiments are not limited in this context.

FIG. 6 illustrates a programming logic 600. Programming logic 600 may be representative of the operations executed by one or more systems described herein, such as system 100 and/or device 108 and/or module 110. As shown in programming logic 600, in one embodiment, the traceback process may be characterized in a general sense by a recursive function where each iteration of the traceback operation may perform the following six functions, for example. At block 602, stage index is set to "L−1" where L is the number of traceback vectors stored in the traceback array. At block 604 current state "CS" is set to "0." At block 606, the i-th vector in the traceback array is loaded in to the traceback vector register. The load operation loads a sequentially stored $2^{K-1}$ bit traceback vector from a traceback memory array stored in traceback memory (e.g., stack memory) for a current state. At block 608, the traceback bit is loaded from the CS-th bit of the traceback vector. Accordingly, the current state "CS" is used as an index to identify the traceback bit among the $2^{K-1}$ bits of the traceback vector. At block 610, a Viterbi decoder bit is identified as the 0-th bit or the least significant bit of the CS. The Viterbi decoder bit is then output. For example, the least-significant bit the current state "CS" (e.g., $S_1$) is saved as the x(n), if needed. At block 612, a new current state or an augmented current state is created. The augmented current state is created by inserting the traceback bit next to the most-significant bit position of the current state "CS" (e.g., $\{T\ S_{K-1} \ldots S_4 S_3 S_2 S_1\}$). Still in block 612, the current state is updated (for the previous stage) by shifting the augmented state (e.g, $\{T\ S_{K-2} \ldots S_4 S_3 S_2\}$). At block 614, the current stage index is decremented and the process returns to block 606 until the stage index reaches 0, for example.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be understood that embodiments may be used in a variety of applications. Although embodiments are not limited in this context, the circuits disclosed herein may be used in many apparatuses such as in electronic devices, battery operated electronic devices, portable electronic devices, wireless devices including transceivers, transmitters, and receivers of a radio system. Radio systems intended to be included within the scope of the embodiments include, by way of example only, cellular radiotelephone communication systems, satellite communication systems, two-way radio communication systems, one-way pagers, two-way pagers, personal communication systems (PCS), personal digital assistants (PDA's) and the like. Electronic devices include cellular telephones, PDA's, Moving Pictures Expert Group (MPEG) layer III (MP3) devices, multimedia devices, global positioning system (GPS) navigation devices, portable games, digital video disk (DVD) devices, DVD video picture books, and iPod, for example.

Types of cellular radiotelephone communication systems intended to be within the scope of the embodiments may comprise, for example, Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

While certain features of the embodiments have been illustrated as described herein, many modifications, substitutions, changes and equivalents will now occur to those skilled in the art. It is therefore to be understood that the appended claims are intended to cover all such modifications and changes as fall within the true scope of the embodiments.

The invention claimed is:

1. An apparatus, comprising:
    a first input to receive a first portion of a state in a state register;
    a second input to receive a second portion of said state in said state register;
    a control unit to load said first portion of said current state to said first input, to load said second portion of said state to said second input, and to generate an output state corresponding to a vector stored at a memory address selected by said first portion of said state and then a portion of said vector selected by said second portion of said state;
    a memory address generator coupled to said control unit; and
    an offset generator coupled to said memory address generator, said offset generator is to receive an input corresponding a number of decoding states corresponding to said state register and to provide a bit mask output to select said memory address within a plurality of consecutive memory addresses and a memory stride to index a subsequent set of said plurality of memory addresses.

2. The apparatus of claim 1, said memory address generator to receive said first portion of said state and to generate said memory address.

3. The apparatus of claim 2, further comprising a multiplexer coupled to said memory address generator, said multiplexer to receive said second portion of said state to generate said output state.

4. The apparatus of claim 3, further comprising a register to store input to said multiplexer, said register to store said vector.

5. A system, comprising:
    an antenna; and
    a device connected to said antenna, said device to include:
    a first input to receive a first portion of a state in a state register;
    a second input to receive a second portion of said state in said state register;
    a control unit to load said first portion of said current state to said first input, to load said second portion of said state to said second input, and to generate an output state corresponding to a vector stored at a memory address selected by said first portion of said state and then a portion of said vector selected by said second portion of said state;

a memory address generator coupled to said control unit; and an offset generator coupled to said memory address generator, said offset generator is to receive an input corresponding a number of decoding states corresponding to said state register and to provide a bit mask output to select said memory address within a plurality of consecutive memory addresses and a memory stride to index a subsequent set of said plurality of memory addresses.

6. The system of claim 5, said memory address generator to receive said first portion of said state and to generate said memory address.

7. The system of claim 6, wherein said device further comprises a multiplexer coupled to said memory address generator, said multiplexer to receive said second portion of said state to generate said output state.

8. The system of claim 7, wherein said device further comprises a register to store input to said multiplexer, said register to store said vector.

9. A method, comprising:
receiving an input corresponding to a number of decoding states;
loading one of a plurality of sequentially stored traceback vectors comprising a plurality of bits from a traceback memory array stored in a traceback memory for a first of said states;
identifying a traceback bit among said plurality of bits of said loaded traceback vector;
providing a bit mask output to select a memory address within a plurality of consecutive memory addresses; and
creating a second state.

10. The method of claim 9, wherein loading comprises loading a stored traceback vector comprising $2^{K-1}$ bits, wherein $2^{K-1}$ is a number of possible states.

11. The method of claim 9, wherein identifying a traceback bit comprises using said first state as an index.

12. The method of claim 9, wherein creating a second state comprises, creating a second state by inserting said traceback bit next to a most-significant bit position of said current state.

13. An article, comprising:
a storage medium;
said storage medium including stored instructions that, when executed by a processor, are operable to:
receive an input corresponding to a number of decoding states;
load one of a plurality of sequentially stored traceback vector comprising a plurality of bits from a traceback memory array stored in a traceback memory for a first state;
identify a traceback bit among said plurality of bits of said loaded traceback vector;
provide a bit mask output to select a memory address within a plurality of consecutive memory addresses; and
create a second state.

14. The article of claim 13, wherein the stored instructions, when executed by a processor, are further operable to load a stored traceback vector comprising $2^{K-1}$ bits, wherein $2^{K-1}$ is a number of possible states.

15. The article of claim 13, wherein the stored instructions, when executed by a processor, are further operable to identify a traceback bit using said first state as an index.

16. The article of claim 13, wherein the stored instructions, when executed by a processor, are further operable to create a second state by inserting said traceback bit next to a most-significant bit position of said current state.

* * * * *